United States Patent [19]
Yoshida

[11] Patent Number: 6,015,726
[45] Date of Patent: Jan. 18, 2000

[54] SEMICONDUCTOR DEVICE AND METHOD OF PRODUCING THE SAME

[75] Inventor: Hiroshi Yoshida, Tokyo, Japan

[73] Assignee: NEC Corporation, Tokyo, Japan

[21] Appl. No.: 09/046,535

[22] Filed: Mar. 24, 1998

[30] Foreign Application Priority Data

Mar. 24, 1997 [JP] Japan .................................. 9-069886

[51] Int. Cl.[7] .......................................... H01L 21/8238
[52] U.S. Cl. ...................... 438/202; 438/233; 438/234; 438/309; 438/363; 438/667; 438/672; 438/675; 148/DIG. 50; 148/DIG. 124
[58] Field of Search ..................... 438/202, 233, 438/234, 309, 363, 667, 672, 675, FOR 165, FOR 219, FOR 346; 148/DIG. 10, DIG. 11, DIG. 50, DIG. 124

[56] References Cited

U.S. PATENT DOCUMENTS

| | | | |
|---|---|---|---|
| 4,871,977 | 10/1989 | Schilling et al. | 330/255 |
| 4,965,220 | 10/1990 | Iwasaki | 437/59 |
| 5,106,765 | 4/1992 | Mizutani et al. | 437/31 |
| 5,296,391 | 3/1994 | Sato et al. | 437/31 |
| 5,358,882 | 10/1994 | Bertagnolli et al. | 437/31 |
| 5,409,843 | 4/1995 | Yamauchi et al. | 438/202 |
| 5,420,053 | 5/1995 | Miyazaki | 437/31 |
| 5,496,745 | 3/1996 | Ryum et al. | 437/31 |
| 5,516,709 | 5/1996 | Yamazaki | 437/31 |
| 5,637,811 | 6/1997 | Yamazaki | 437/31 |
| 5,719,082 | 2/1998 | Violette | 438/309 |

FOREIGN PATENT DOCUMENTS 7-142498  6/1995  Japan .

*Primary Examiner*—George Fourson
*Assistant Examiner*—Long Pham
*Attorney, Agent, or Firm*—Foley & Lardner

[57] ABSTRACT

A method of producing a semiconductor device having a bipolar transistor and a CMOS (Complementary Metal Oxide Semiconductor) transistor is disclosed. An epitaxial layer is formed on a semiconductor substrate having an n-type buried layer and a p-type buried layer thereinside. A field oxide film is formed on the epitaxial layer for delimiting active regions. An n-type and a p-type well region each is formed in a particular position. An insulation film playing the role of a gate oxide film at the same time is formed over the entire surface of the substrate. Subsequently, an emitter contact hole and a collector contact hole each extending to the epitaxial layer are formed at the same time. A polysilicon layer is formed over the entire surface of the substrate and then etched to form an emitter electrode and a gate electrode each having a preselected configuration. The resulting semiconductor device achieves a desirable current drive ability.

20 Claims, 21 Drawing Sheets

6,015,726

SEMICONDUCTOR DEVICE AND METHOD OF PRODUCING THE SAME

BACKGROUND OF THE INVENTION

The present invention relates to a semiconductor device having a bipolar transistor and a CMOS (Complementary Metal Oxide Semiconductor) transistor on a single substrate, and a method of producing the same.

A semiconductor device having a BiCMOS structure, i.e., having a bipolar transistor and a CMOS transistor on a single substrate is conventional. However, a conventional method of producing such a semiconductor device is that an n-type collector region is not achievable without resorting to extra steps, i.e., a lithographic step, an ion implanting step and a diffusing step which increase the production cost of the device. In addition, to guarantee a sufficient breakdown voltage between a base and a collector, a base diffusion layer and a collector diffusion layer must be spaced by a great distance, hindering the miniaturization of the transistor.

Japanese Patent Laid-Open Publication No. 7-142498 teaches a method capable of producing the above semiconductor device with a reduced number of production steps. This method, however, brings about another drawback that the polysilicon layer of an emitter electrode and a gate electrode must be overetched by 150% to 300%. Such an amount of overetching causes a CMOS gate electrode to have an inversely tapered configuration and thereby brings a source-drain diffusion layer out of alignment with the ends of the gate electrode. As a result, the current drive ability of the transistor is deteriorated. Moreover, when a direct contact for leading out an electrode from a diffusion layer region existing in a memory cell is present, a connection resistance between the diffusion layer and the direct contact lead-out electrode is increased by about several ten to several hundred kilohms, rendering the operation of the memory cell unstable.

Technologies relating to the present invention are also taught in, e.g., U.S. Pat. No. 5,358,882 to Bertagnolli et al.

SUMMARY OF THE INVENTION

It is therefore an object of the present invention to provide a semiconductor device having a BiCMOS structure and capable of reducing the number of production steps and cost, and a method of producing the same.

It is another object of the present invention to provide a semiconductor device having a BiCMOS structure and having a desirable current drive ability, and a method of producing the same.

It is a further object of the present invention to provide a semiconductor device having a BiCMOS structure and capable of preventing a connection resistance from increasing when a direct contact is present, and a method of producing the same.

A method of producing a semiconductor device having a bipolar transistor and a CMOS transistor on a single semiconductor substrate of the present invention begins with a step of forming a first conductivity type buried layer and a second conductivity type buried layer on the semiconductor substrate, and growing an epitaxial layer over the entire surface of the substrate. A first insulation film is formed for delimiting an active region of a bipolar transistor, an active region of a first conductivity type MOS transistor, and an active region of a second conductivity type MOS transistor. A first conductivity type or a second conductivity type well is formed in a preselected position separating the active regions of the first and second conductivity type MOS transistors and the CMOS transistor and bipolar transistor. A second insulation film is formed on the surfaces of the active regions of the bipolar transistor, first conductive type MOS transistor, and second conductivity type MOS transistor. The second insulation film constitutes a gate oxide film at the same time. In the second insulation film and first insulation film, respectively, above the active region of the bipolar transistor, an emitter contact hole and a collector contact hole both extending to the epitaxial layer are formed at the same time. A polysilicon layer is formed over the entire surface of the semiconductor substrate. The polysilicon layer is etched to thereby form an emitter electrode and a gate electrode each having a preselected configuration.

BRIEF DESCRIPTION OF THE DRAWINGS

The above and other objects, features and advantages of the present invention will become apparent from the following detailed description taken with the accompanying drawings in which.

Figure 1:
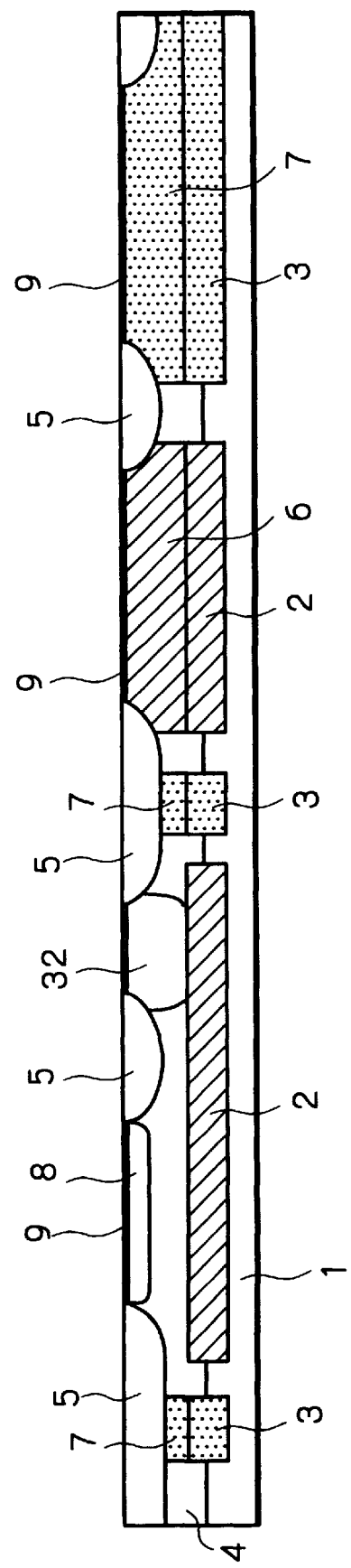
FIGS. 1–4 are sections showing a conventional method of producing a semiconductor device.

In the drawings, identical references denote identical structural elements.

DESCRIPTION OF THE PREFERRED EMBODIMENTS

To better understand the present invention, brief reference will be made to some conventional methods of producing a semiconductor device having a BiCMOS structure.

FIGS. 1–4 demonstrate one conventional method of producing a semiconductor device having a BiCMOS structure. First, as shown in FIG. 1, an n-type epitaxial layer 4 is formed on a p-type silicon substrate 1 having an n-type buried layer 2 and a p-type buried layer 3 thereinside. A field oxide layer 5 is formed on the epitaxial layer 4 by LOCOS (Local Oxidation of Silicon). Subsequently, an n-type well region 6, a p-type well region 7, a bipolar transistor base region 8 and an n-type collector lead-out region 32 are formed, and then a gate oxide film 9 is formed to a thickness of 50 Å to 200 Å. To form the lead-out region 32, phosphor is implanted in a dose of $1 \times 10^{15} \text{cm}^{-2}$ to $5 \times 10^{15} \text{cm}^{-2}$, and then the impurity is activated and diffused by annealing.

Figure 2:
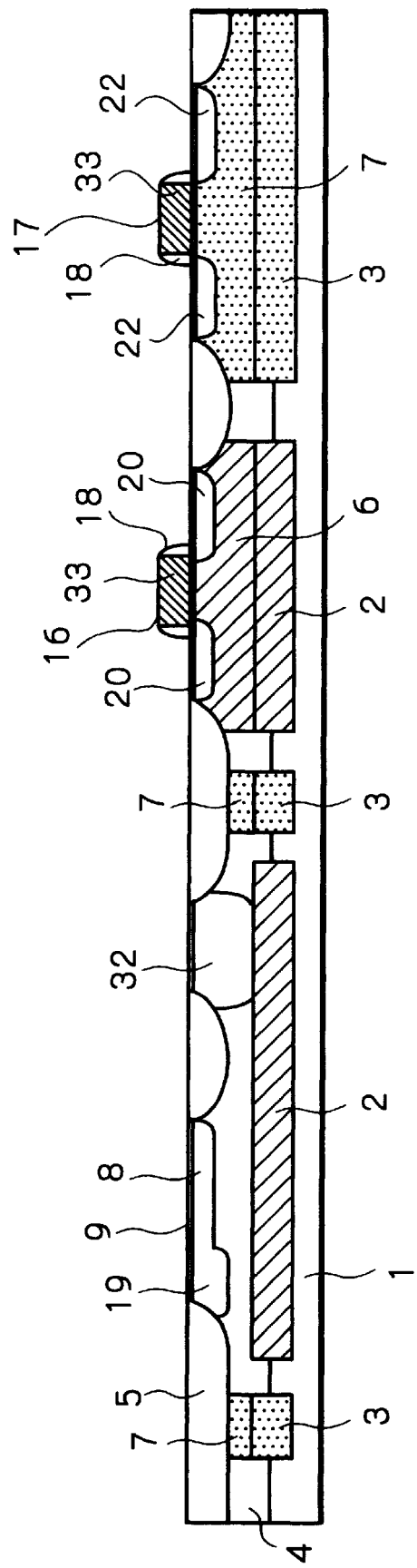

As shown in FIG. 2, a polysilicon layer 33 is formed over the entire substrate 1 and then etched to form gate electrodes 16 and 17 of a p-type and an n-type MOS transistor, respectively. After an oxide film has been formed to a thickness of 1,000Å, side walls 18 are formed around the gate electrodes 16 and 17 by anisotropic dry etching. Subsequently, boron ions are implanted in a dose of $5\times10^{15}$ cm$^{-2}$ to $7\times10^{15}$ cm$^{-2}$ in an extrinsic base region 19 of the bipolar transistor and the gate electrode 16 and a source and drain region 20 of the p-type MOS transistor. On the other hand, arsenic ions are implanted in the gate electrode 17 and a source and drain region 22 of the n-type MOS transistor in a dose of $1\times10^{15}$ cm$^{-2}$ to $2\times10^{15}$ cm$^{-2}$. This is followed by annealing effected at 850° C. to 900° C. for activating the implanted impurities.

Figure 3:
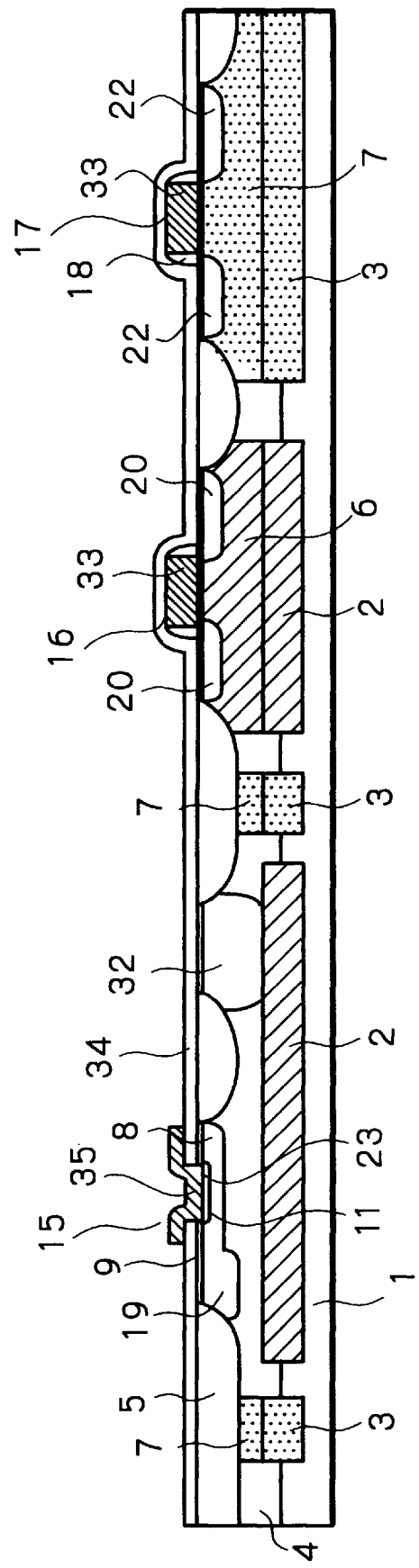

As shown in FIG. 3, a 1,000 Å to 2,000 Å thick oxide film 34 is grown, and then an emitter contact hole 11 is formed. Thereafter, a 2,000 Å to 3,000 Å thick polysilicon layer 35 is formed over the entire substrate 1. After arsenic has been introduced into the polysilicon layer 35 in a dose of $1\times10^{16}$ cm$^{-2}$ to $2\times10^{16}$ cm$^{-2}$ by ion implantation, an emitter electrode 15 is formed by patterning. The resulting laminate is annealed in a nitrogen atmosphere in order to diffuse arsenic from the polysilicon layer 35 to the base region 8, so that an emitter region 23 is formed.

Figure 4:
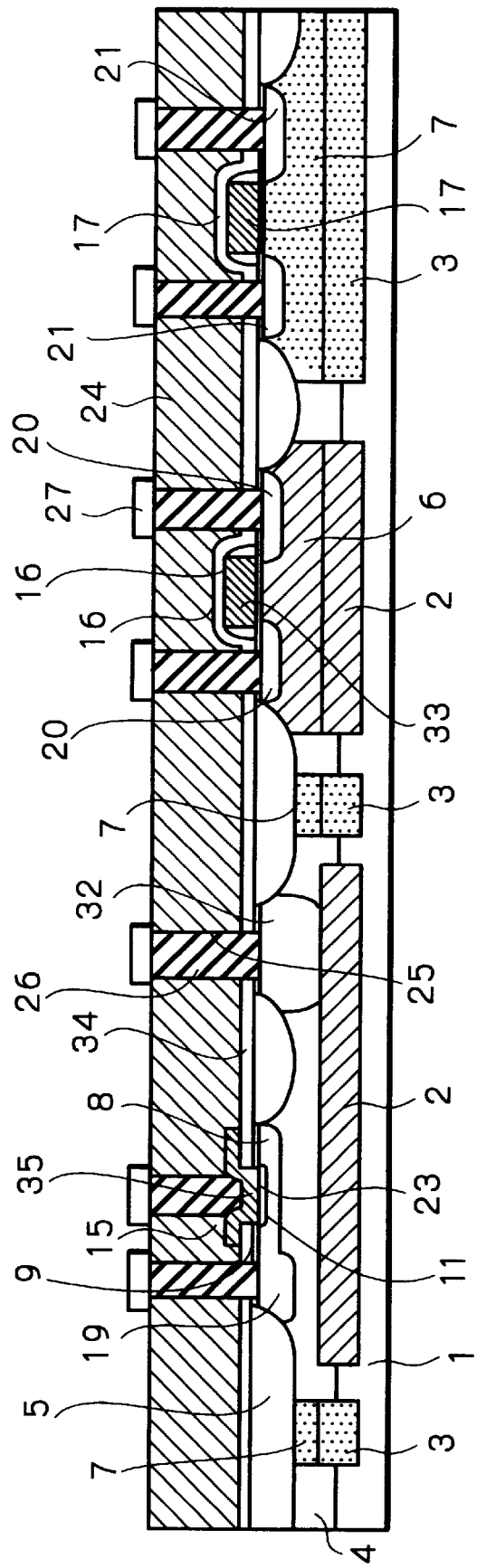

As shown in FIG. 4, after an interlayer insulation film 24 has been formed on the above laminate, contact holes 25 are formed in the insulation film 24 and then filled with plugs 26 implemented by tungsten or similar substance. Finally, metal wirings 27 are formed to complete a semiconductor device.

In the structure shown in FIG. 4, the n-type buried layer 2 and wirings 27 are interconnected by the n-type collector region having a low resistance. This allows the collector resistance of the bipolar transistor to be lowered to 50 Ω or below. However, the n-type collector region is not achievable without resorting to extra steps, i.e., a lithographic step, an ion implanting step and a diffusing step which increase the production cost of the semiconductor device.

Figure 10:
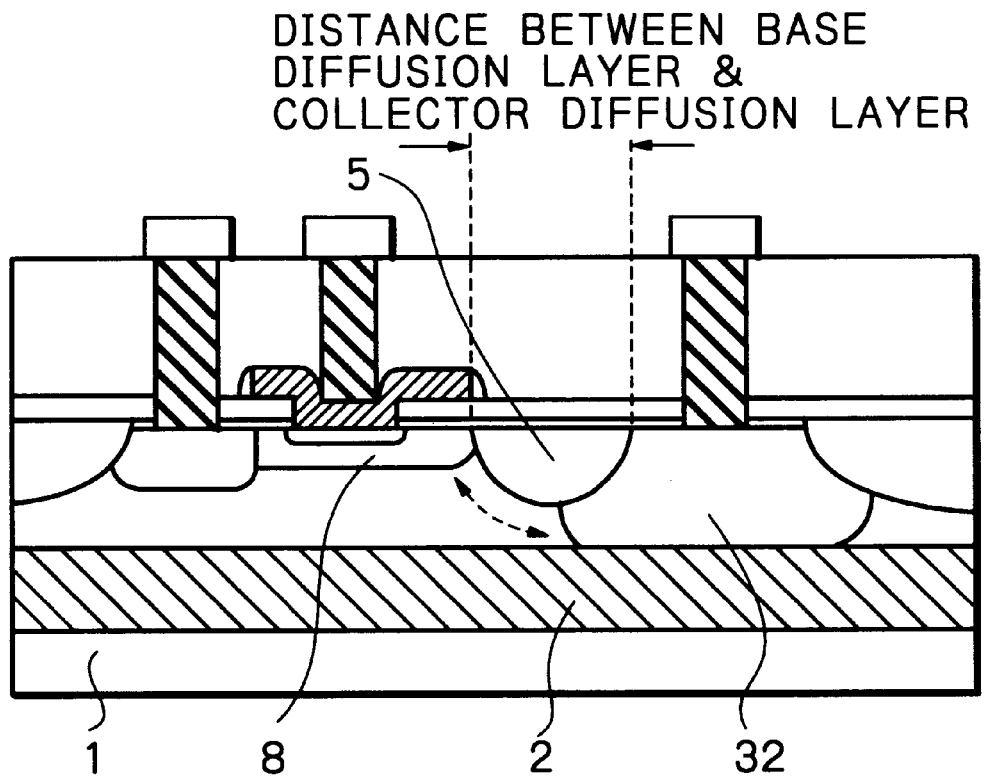
FIGS. 10 and 11 are sections for describing problems particular to the conventional procedures.

Further, in the above conventional procedure, the n-type impurity of high concentration is implanted in the collector region and then activated and diffused by high temperature annealing. This brings about a problem that, as shown in FIG. 10, phosphor contained in the n-type collector region is diffused even in the lateral direction of the region as far as a position adjoining the base diffusion layer or p-type region, thereby lowering the breakdown voltage between the base and the collector. To guarantee a sufficient breakdown voltage, the base diffusion layer and collector diffusion layer must be spaced by a great distance. Such a distance hinders the miniaturization of the transistor.

Figure 5:
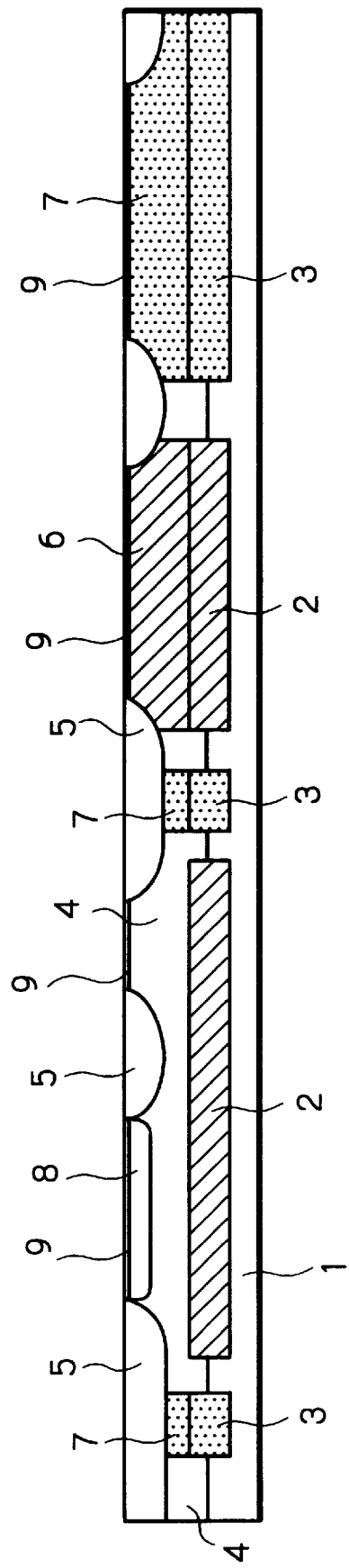
FIGS. 5–9 are sections showing another conventional method of producing a semiconductor device.

Japanese Pat. Laid-Open Publication No. 7-142498 mentioned earlier teaches a method capable of reducing the number of production steps, as will be described with reference to FIGS. 5–9. First, as shown in FIG. 5, an n-type epitaxial layer 4 is formed on a p-type silicon substrate 1 having an n-type buried layer 2 and a p-type buried layer 3 thereinside. A field oxide layer 5 is formed on the epitaxial layer 4 by LOCOS. Subsequently, an n-type well region 6, a p-type well region 7, a bipolar transistor base region 8 and a 50 Å to 200 Å thick gate oxide film 9 are formed.

Figure 6:
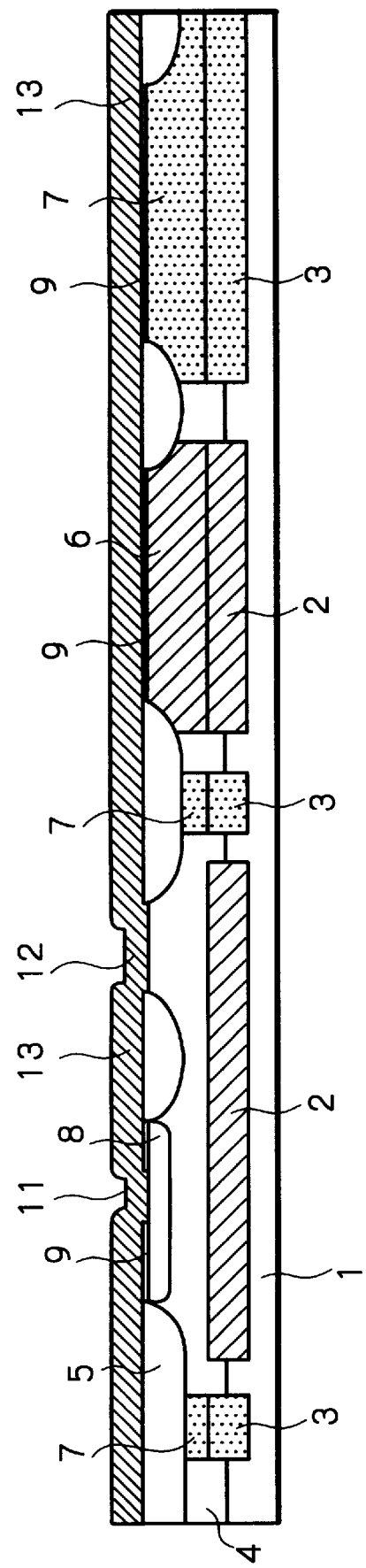

As shown in FIG. 6, the gate oxide film 9 is etched to form an emitter contact hole 11 and a collector contact hole 12. Then, a 1,000 Å to 2,000 Å thick polysilicon layer 13 is formed over the entire surface of the substrate 1.

Figure 7:
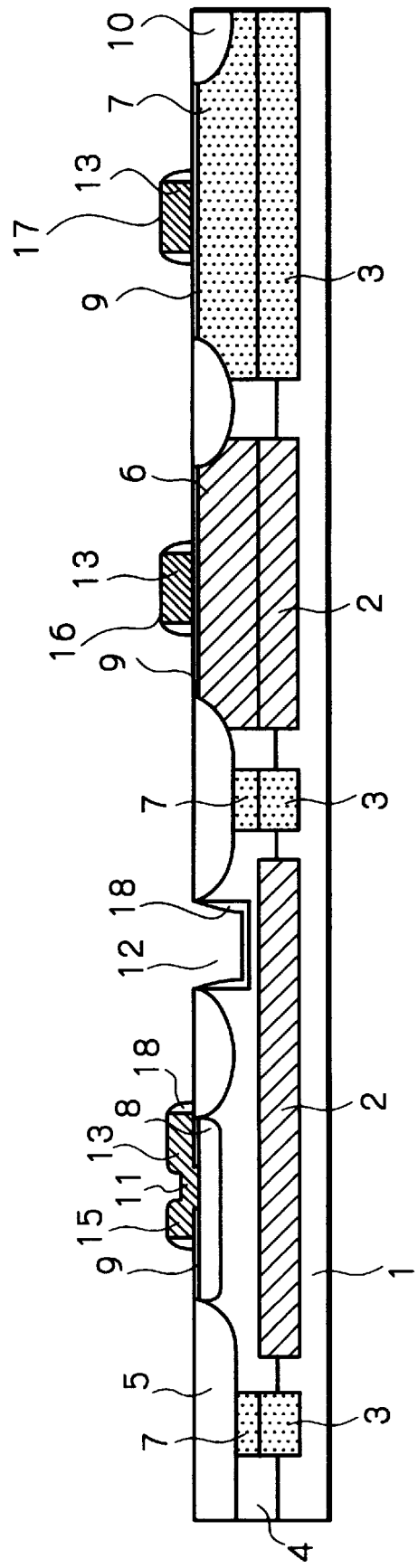

As shown in FIG. 7, the polysilicon layer 13 is etched to form an emitter electrode 15 of the bipolar transistor, a gate electrode 16 of a p-type MOS transistor and a gate electrode 17 of an n-type MOS transistor. At the same time, the epitaxial layer 4 of the collector contact hole 12 is overetched so as to form a 3,000 Å to 6,000 Å deep trench. After an oxide film has been formed to a thickness of 1,000 Å, it is etched in order to form side walls 18 around the emitter electrode 15 and gate electrode 16 and 17.

Figure 8:
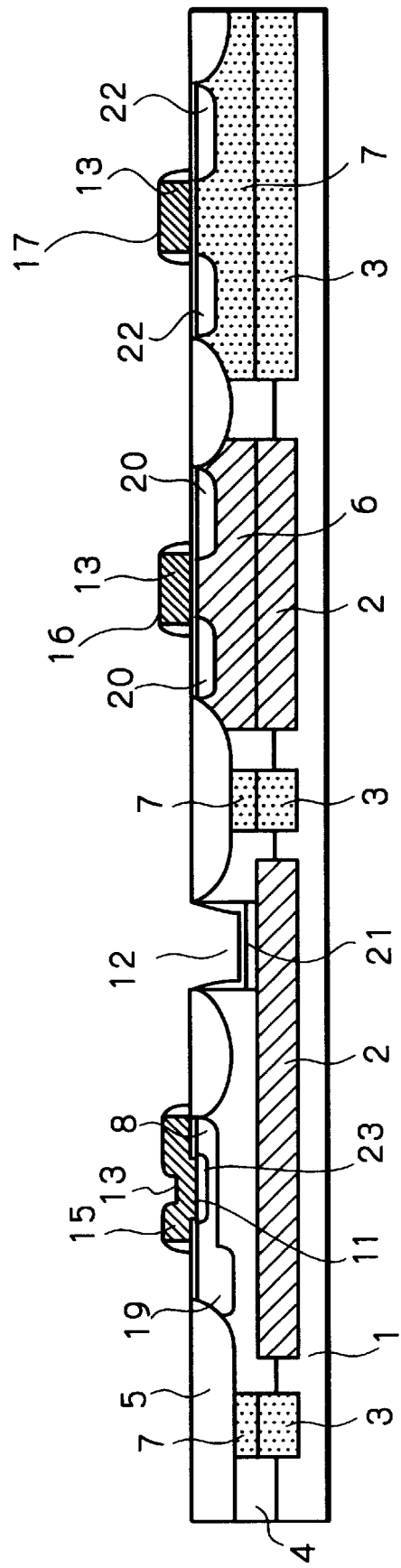

As shown in FIG. 8, boron ions are implanted in a dose of $5\times10^{15}$ cm$^{-2}$ to $9\times10^{15}$ cm$^{-2}$ in an extrinsic base region 19 of the bipolar transistor and the gate electrode 16 and a source and drain region 20 of the p-type MOS transistor. On the other hand, arsenic ions are implanted in the emitter electrode 15 and a collector contact diffusion layer 21 of the bipolar transistor and the gate electrode 17 and a source and drain region 22 of the n-type MOS transistor. This is followed by annealing effected at 850° C. to 900° C. for activating the implanted impurities. At this instant, arsenic is diffused from the polysilicon layer 13 of the bipolar transistor emitter electrode 15 to the base region 8, forming an emitter region 23.

Figure 9:
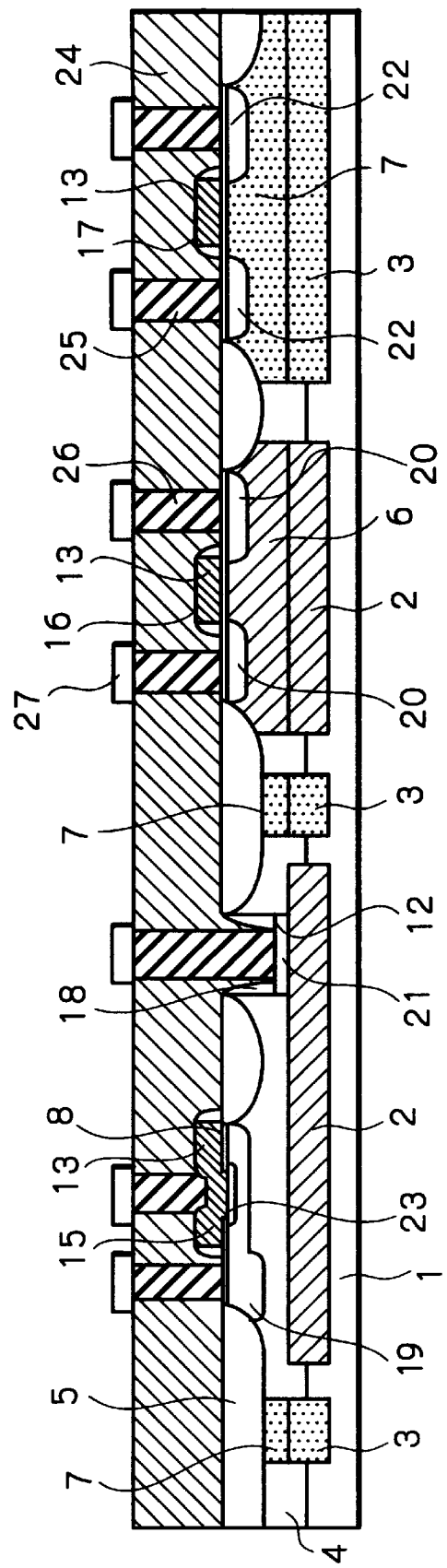

As shown in FIG. 9, after an interlayer insulation film 24 has been formed on the above laminate, contact holes 25 are formed and filled with plugs 26 implemented by tungsten or similar substance. Finally, metal wirings 27 are formed to complete a semiconductor device.

In the configuration shown in FIG. 9, a trench is formed in the collector portion of the bipolar transistor by overetching during formation of the emitter electrode and gate electrode. The wiring effected via the trench implements a collector lead-out portion. This successfully omits the photolithographic step and annealing step effected to form the n-type collector region in the procedure of FIGS. 1–4. In addition, the emitter electrode and gate electrode of the bipolar transistor share the same polysilicon layer, so that the procedure is further simplified.

Figure 11:
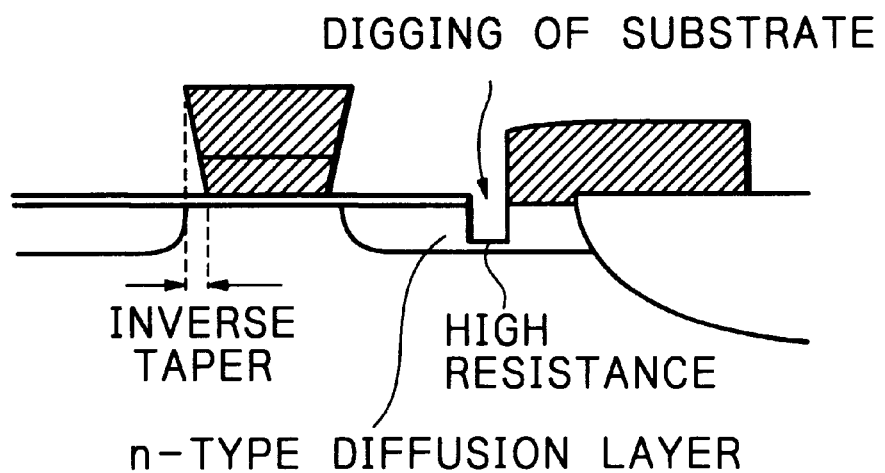

However, the procedure shown in FIGS. 5–9 brings about another problem, as follows. To reduce the collector resistance, the trench must be formed in the bipolar transistor collector portion to a thickness of 3,000 Å to 6,000 Å by overetching. Specifically, the polysilicon layer of the emitter electrode and gate electrode must be overetched by 150% to 300%. As shown in FIG. 11, such an amount of overetching causes the CMOS gate electrode to have an inversely tapered configuration and thereby brings the source-drain diffusion layer out of alignment with the ends of the gate electrode. As a result, the current drive ability of the transistor, among others, is deteriorated. Moreover, as also shown in FIG. 11, assume that a direct contact for leading out an electrode from a diffusion layer region existing in a memory cell is present. Then, the portion of the silicon substrate adjoining the direct contact is dug in by the overetching to the same depth as the trench (3,000 Å to 6,000 Å). Consequently, a connection resistance between the diffusion layer and the direct contact lead-out electrode is increased by about several ten to several hundred kilohms, rendering the operation of the memory cell unstable.

Preferred embodiments of the the present invention free from the above problems will be described hereinafter.

1st Embodiment

Figure 15:
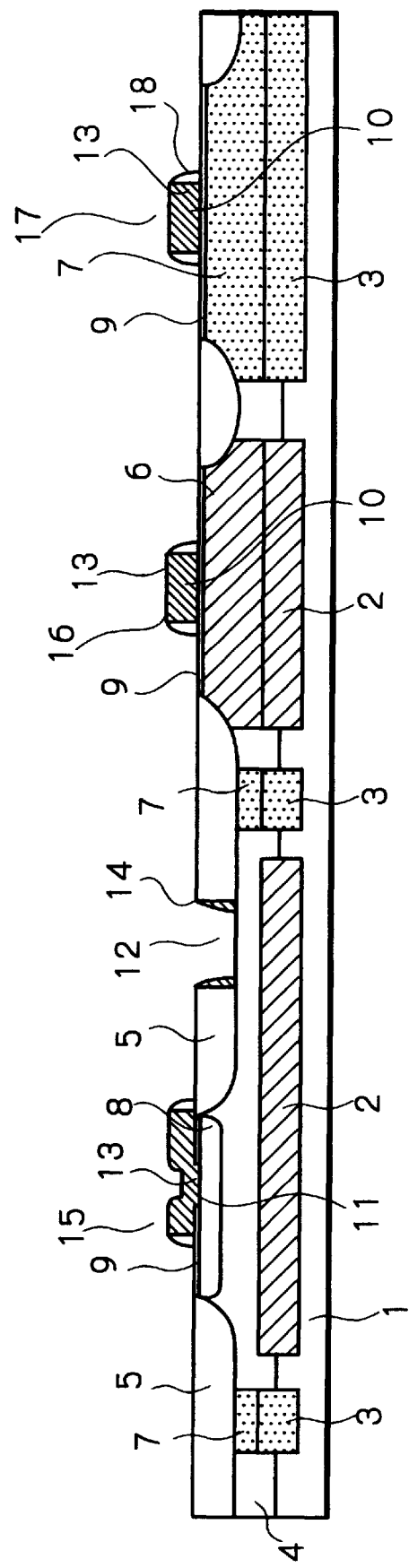
Figure 16:
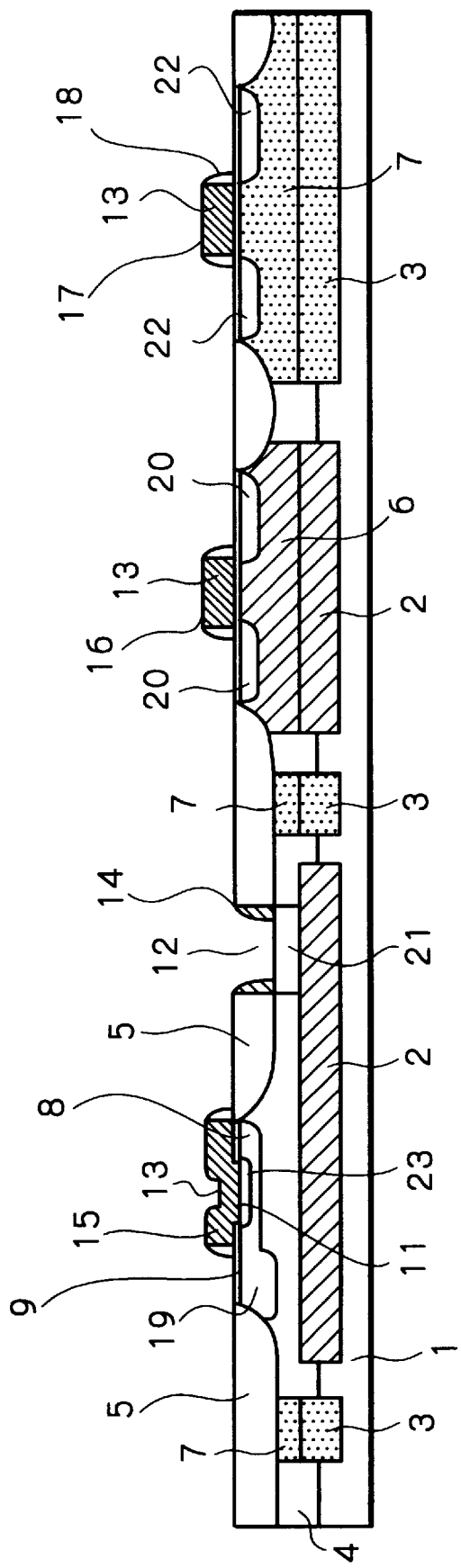
Figure 17:
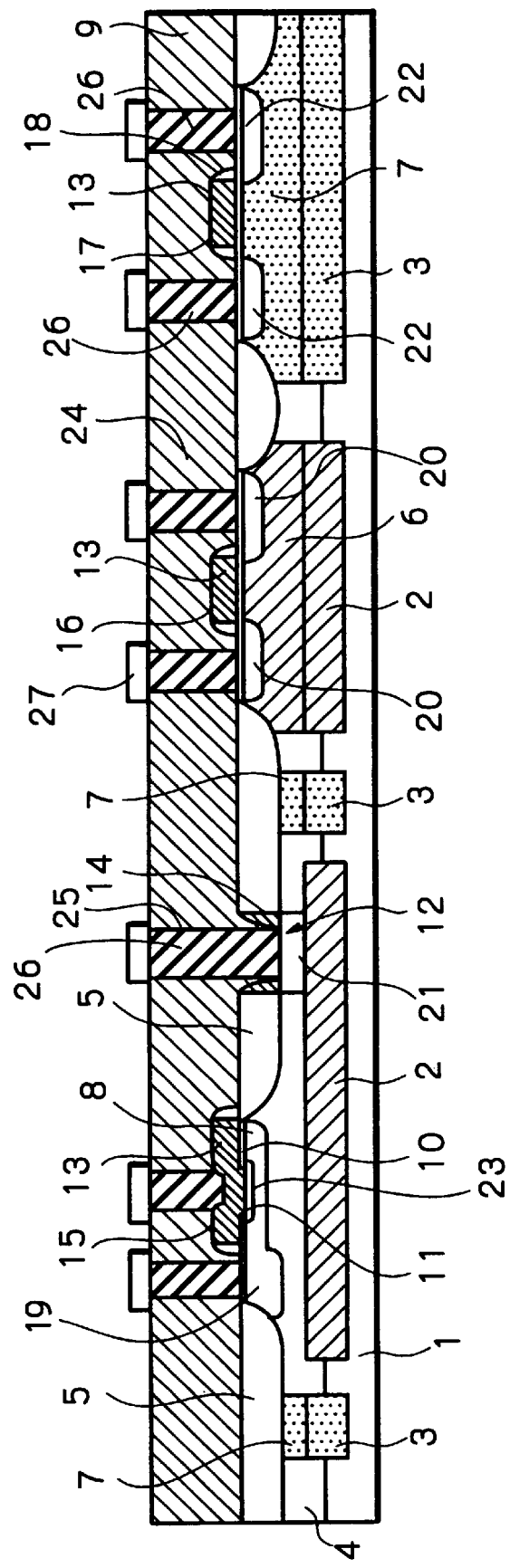

Referring to FIGS. 12–17, a first embodiment of the present invention will be described. FIG. 17 shows a semiconductor device produced by a procedure to be described. As shown, the semiconductor device includes a p-type silicon substrate 1, an n-type buried layer 2, a p-type buried layer 3, an n-type epitaxial layer 4, a field oxide layer or first insulation layer 5, an n-type well region 6, a p-type well region 7, a base region 8 of a bipolar transistor, and a second insulation film 9 playing the role of the gate oxide film of a MOS transistor at the same time. The semiconductor device further includes a photoresist layer 10, an emitter contact hole II formed in the second insulation film 9, a collector contact hole 12 formed in the firs t insulation film 5, a polysilicon layer 13, polysilicon side walls 14, an emitter electrode 15 of the bipolar transistor, a gate electrode 16 of a p-type MOS transistor, a gate electrode 17 of an n-type MOS transistor, oxide side walls 18, an extrinsic base region 19, a source and drain region 20 of the p-type MOS transistor, a collector contact diffusion layer 21, a source and drain region 22 of the n-type MOS transistor, an emitter region 23, an interlayer insulation film 24, contact holes 25, plugs 26 filling the contact holes 25 and formed of tungsten or similar substance, and metal wirings 27.

In the structure shown in FIG. 17, the collector contact hole 12 extends throughout the field oxide layer 5 to the n-type epitaxial layer 4. The n-type buried layer 2 playing the role of the buried collector of the bipolar transistor and the plug 26 are interconnected by the collector contact hole 12. Further, the emitter electrode 15, p-type MOS gate electrode 16 and n-type MOS gate electrode 17 share the same polysilicon layer 13.

Figure 12:
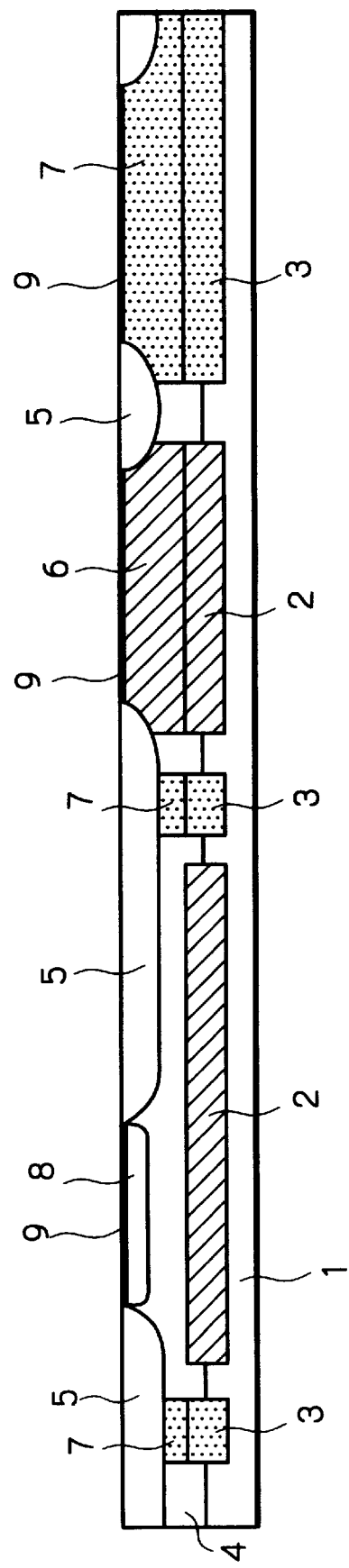
FIGS. 12–17 are sections demonstrating a first embodiment of the method of producing a semiconductor in accordance with the present invention.

Specifically, as shown in FIG. 12, the n-type and p-type buried layers 2 and 3, respectively, are formed in the p-type silicon substrate 1. After the n-type epitaxial layer 4 has been formed on the substrate 1, the field oxide film 5 which is 3,000 Å to 6,000 Å thick is formed on the epitaxial layer 4 by LOCOS. Then, the n-type well region 6, p-type well region 7 and the base region of the bipolar transistor are formed. Subsequently, the gate oxide film 9 of the MOS transistor is formed to a thickness of 50 Å to 200 Å.

Figure 13:
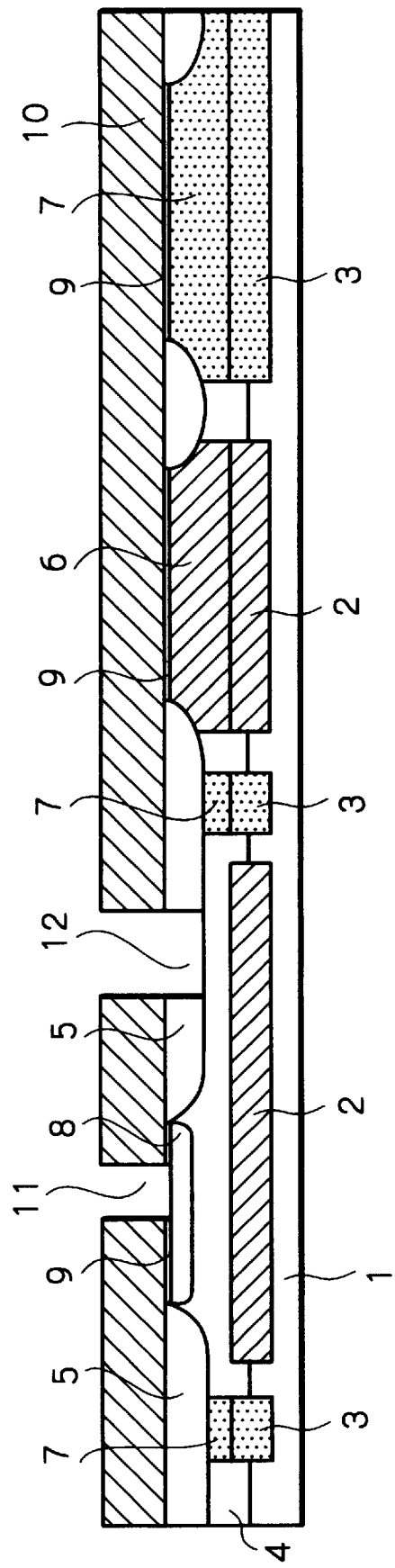

As shown in FIG. 13, the gate oxide film 9 and field oxide film 5 have their portions corresponding to the emitter contact hole 11 and collector contact hole 12 removed by dry etching with the photoresist 10 serving as a mask. As a result, the base region 8 of the emitter contact hole 11 and the n-type epitaxial layer 4 of the collector contact hole 12 are exposed to the outside. At this instant, the conventional method would etch the above oxide films 9 and 5 more in the emitter contact hole 11 than in the collector contact hole 12. In the illustrative embodiment, to prevent the epitaxial layer 4 (including the base region 8) of the emitter contact hole 11 from being dug in, there should preferably be used an etching method etching silicon at a rate about 1/40 to 1/50 of a rate at which it etches an oxide film (high selection ratio). Such a high selection ratio may be implemented by, e.g., reactive ion etching using a gas mixture of $SF_6$ and CO and taught in "Japan Journal of Applied Physics", Vol. 33 (1994), pp. 2151–2156 by way of example.

Figure 14:
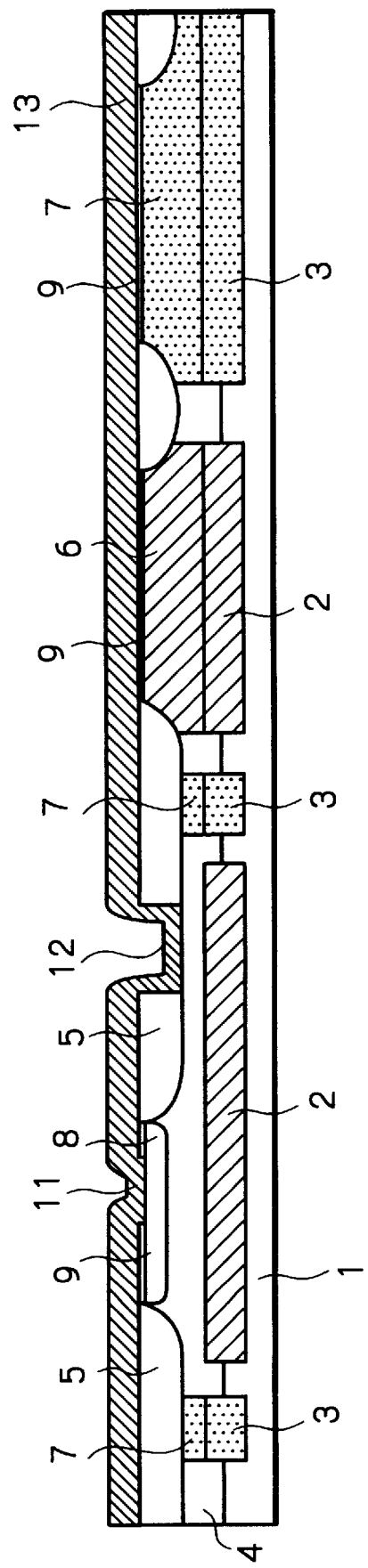

As shown in FIG. 14, the polysilicon layer 13 whose thickness is 1,500 Å to 2,000 Å is caused to grow over the entire surface of the substrate 1, including the emitter contact hole 11 and collector contact hole 12.

As shown in FIG. 15, the polysilicon layer 13 is etched in order to form the emitter electrode 15 of the bipolar transistor and the gate electrodes 16 and 17 of the p-type and n-type MOS transistors, respectively. At this instant, the polysilicon layer 13 should only be overetched by about 10% to 30% of the thickness of the layer 13. This prevents each gate electrode of the CMOS transistor from being inversely tapered, as shown in FIG. 11. The polysilicon layer 13 forms the polysilicon side walls 14 around the collector contact hole 12. Subsequently, a 1,000 Å thick oxide film is formed, and then the oxide side walls 18 are formed around the emitter electrode 15 and gate electrodes 16 and 17 by anisotropic dry etching.

As shown in FIG. 16, boron ions are implanted in the extrinsic base region 19 of the bipolar transistor and the gate electrode 16 and source and drain region 20 of the p-type MOS transistor in a dose of $5\times10^{15}$ $cm^{-2}$ to $9\times10^{15}$ $cm^{-2}$. On the other hand, arsenic ions are implanted in the emitter electrode 15 and collector contact diffusion layer 21 of the bipolar transistor and the gate electrode 17 and source and drain region 22 of the n-type MOS transistor in a dose of $1\times10^{16}$ $cm^{-2}$ to $2\times10^{16}$ $cm^{-2}$. The n-type impurity may be implemented by phosphor, if desired. This is followed by annealing effected in a nitrogen atmosphere at 850° C. to 900° C. in order to activate the implanted impurities. At this time, arsenic is diffused from the polysilicon layer 13 to the base region 8 in the emitter electrode 15 of the bipolar transistor, forming the emitter region 23.

As shown in FIG. 17, the interlayer insulation film 24 is formed on the above laminate, and then the contact holes 25 are formed. It is to be noted that the depth of the contact hole differs from the emitter electrode 15 to the collector contact hole 12 by about 5,000 Å to 8,000 Å, as measured from the surface of the interlayer insulation film 24. In light of this, the previously mentioned etching method using a $SF_6$ and CO mixture is desirable because it protect the emitter electrode 15 from overetching. Thereafter, the contact holes 25 are filled with the plugs 26 formed of tungsten or similar substance. Finally, the metal wirings 27 are formed to complete the semiconductor device shown in FIG. 17.

2nd Embodiment

Figure 18:
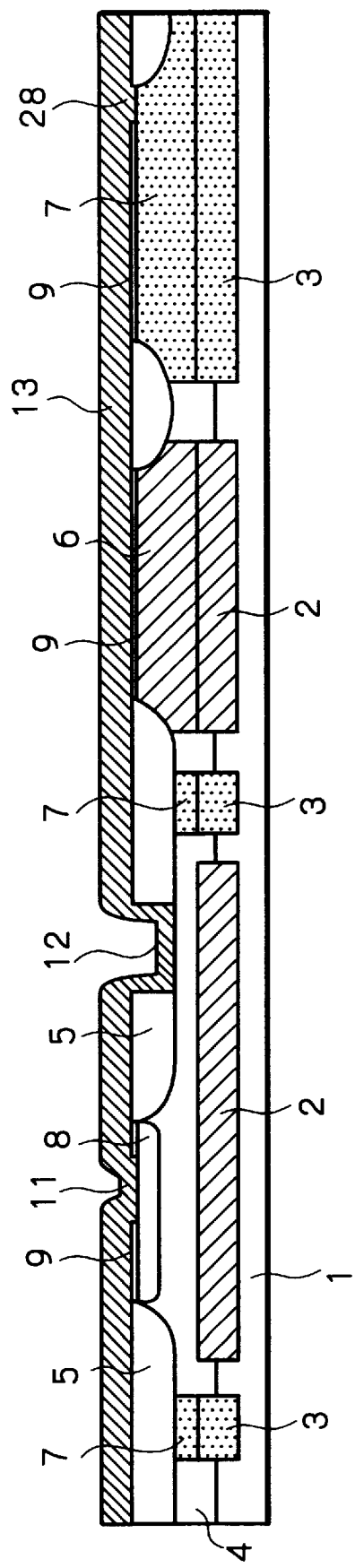
FIGS. 18–20 are sections showing a second embodiment of the present invention.
Figure 19:
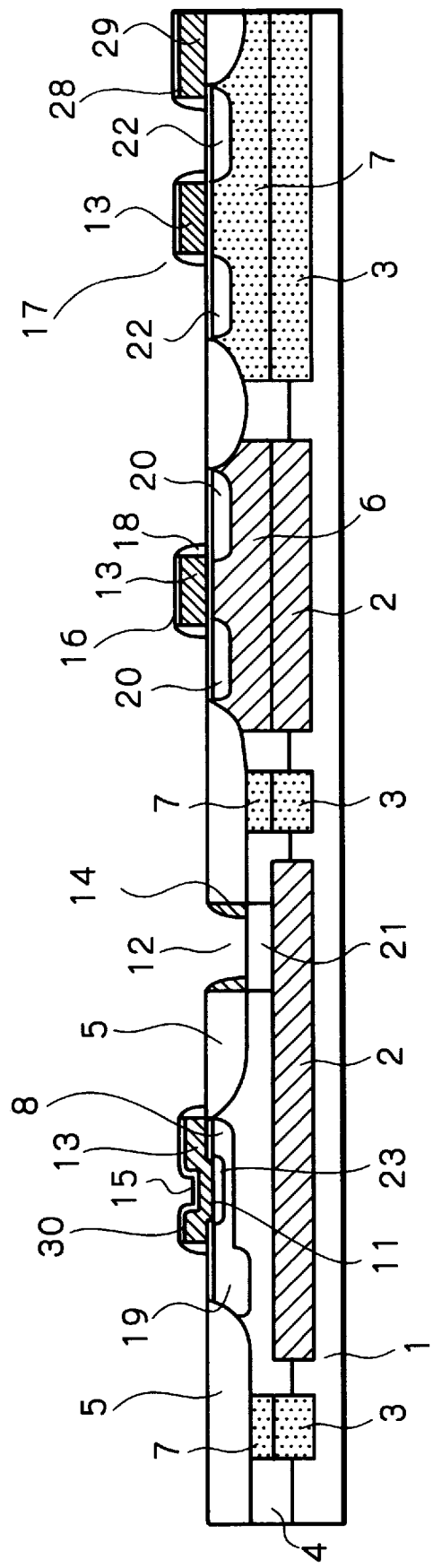

A second embodiment of the present invention will be described with reference to FIGS. 18–20. A procedure to be described also begins with the step shown in FIG. 12. As shown in FIG. 19, the step of FIG. 12 is followed by the step of etching the gate oxide film 9 and field oxide film 5 in the emitter contact hole 11 and collector contact hole 12 of the bipolar transistor and a direct contact 28. As a result, the epitaxial layer 4 is exposed to the outside. Subsequently, the 1,500 Å to 2,000 polysilicon layer 13, is grown over the entire surface of the substrate 1. It is to be noted that the direct contact 28 is a contact structure for leading out an electrode from a transistor diffusion layer region existing in a memory cell.

The polysilicon layer 13 is so etched as to form the emitter electrode 15 of the bipolar transistor, the gate electrode 16 of the p-type MOS transistor, the gate electrode 17 of the n-type MOS transistor, and a direct contact lead-out electrode 29. Again, the polysilicon layer 13 should only be overetched by about 10% to 30% of the thickness of the layer 13, so that the gate electrodes of the CMOS transistor are prevented from being inversely tapered. In addition, the substrate 1 is not dug in by more than 500 Å around the direct contact 28.

After a 1,000 Å thick oxide film has been formed on the above laminate, the oxide side walls 18 are formed around the emitter electrode 15, gate electrodes 16 and 17 and direct contact lead-out electrode 29 by anisotropic dry etching.

Subsequently, boron ions are implanted in the extrinsic base region 19 of the bipolar transistor and the gate electrode 16 and source and drain region 20 of the p-type MOS transistor in a dose of $5\times10^{15}$ $cm^{-2}$ to $9\times10^{15}$ $cm^{-2}$. On the other hand, arsenic ions are implanted in the emitter electrode 15 and collector contact diffusion layer 21 of the bipolar transistor, the gate electrode 17 and source and drain region 22 of the n-type MOS transistor and the lead-out electrode 29 in a dose of $1\times10^{16}$ $cm^{-2}$ to $2\times10^{16}$ $cm^{-2}$. Again, the n-type impurity may be implemented by phosphor, if desired.

This is followed by annealing effected in a nitrogen atmosphere at 850° C. to 900° C. in order to activate the implanted impurities. At this time, arsenic is diffused from the polysilicon layer 13 to the base region 8 in the emitter electrode 15 of the bipolar transistor, forming the emitter region 23. Also, in the lead-out electrode 29, arsenic is diffused from the polysilicon layer 13 to the substrate 1, serving to reduce the contact resistance.

After the annealing, an about 200 Å titanium film is formed by sputtering or similar technology over the entire surface of the laminate. Thereafter, the laminate is subjected to annealing in order to form a silicide layer 30 on the emitter electrode 15, extrinsic base region 19 and collector diffusion layer 21 of the bipolar transistor and the diffusion layers 20 and 22, gate electrodes 16 and 17 and lead-out electrode 29 of the CMOS transistor, as shown in FIG. 19.

Figure 20:
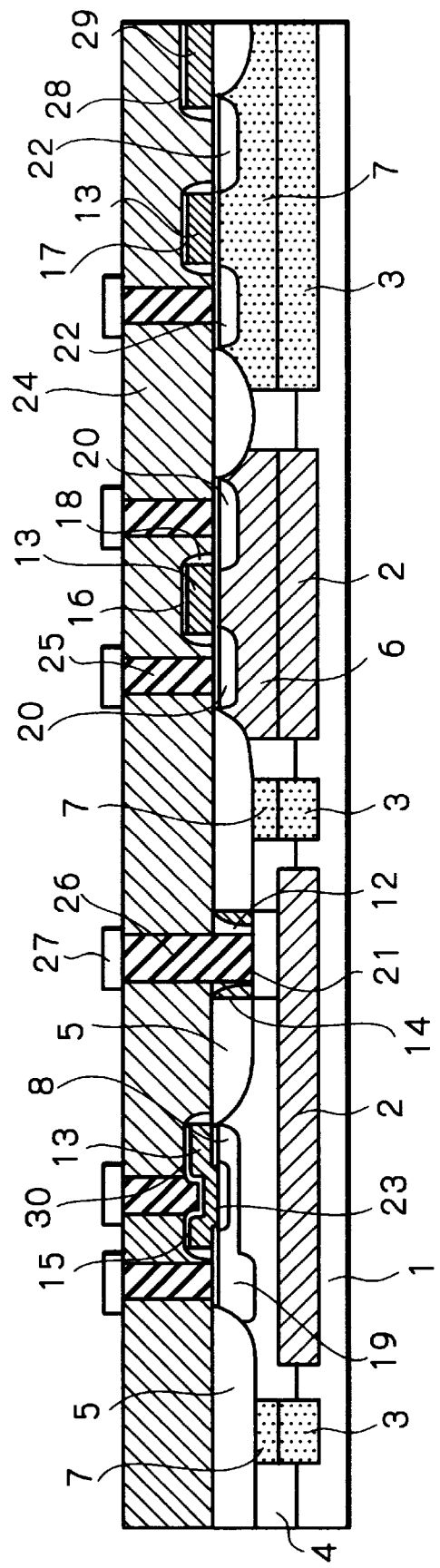
Figure 21:
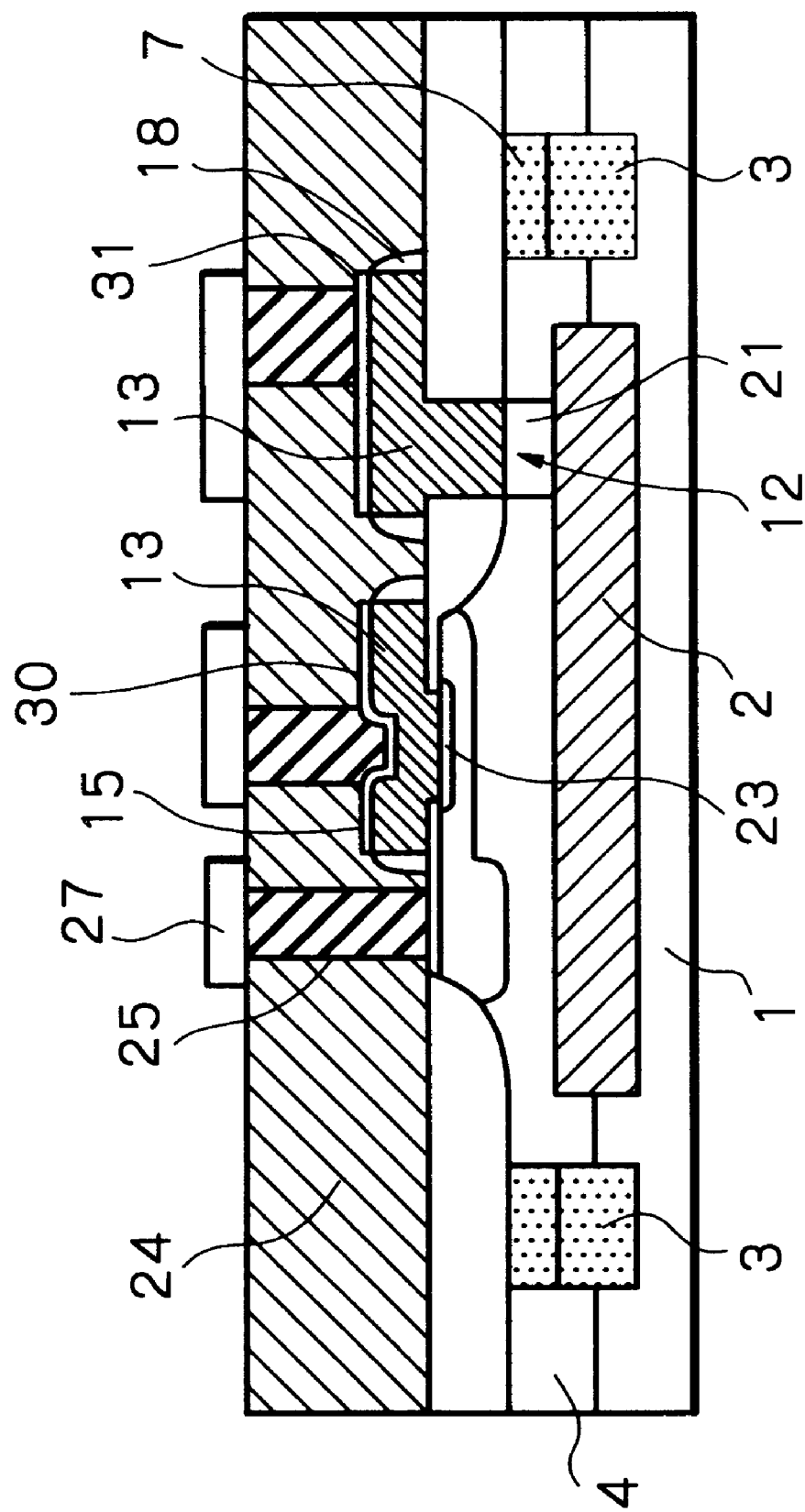
FIG. 21 is a section showing a third embodiment of the present invention.

Subsequently, as shown in FIG. 20, the interlayer insulation film 24 and contact holes 25 are sequentially formed. The contact holes 25 are filled with the plugs 26, and then the metal wirings 27 are formed to complete the semiconductor device shown in FIG. 20.

The second embodiment not only achieves the desirable CMOS gate electrode configuration, but also reduces the undesirable digging depth of the silicon substrate 1 in the direct contact portion and thereby reduces a direct contact lead-out resistance. Moreover, the second embodiment is capable of forming a low resistance silicide layer in the CMOS transistor portion, and reducing the resistance of the bipolar transistor emitter contact hole and that of the direct contact lead-out electrode at the same time.

3rd Embodiment

A third embodiment is identical with the second embodiment except for the following. In the third embodiment, after the step shown in FIG. 18, a collector lead-out electrode 31 is formed in the portion corresponding to the bipolar transistor collector contact hole 12 in the event of etching of the polysilicon layer 13. The collector contact diffusion layer 21, like the bipolar transistor emitter region 23, is formed by the diffusion of the n-type impurity from the polysilicon layer 13. The metal wirings 27 are connected via the contact hole 25 above the lead-out electrode 31.

4th Embodiment

Figure 22A:
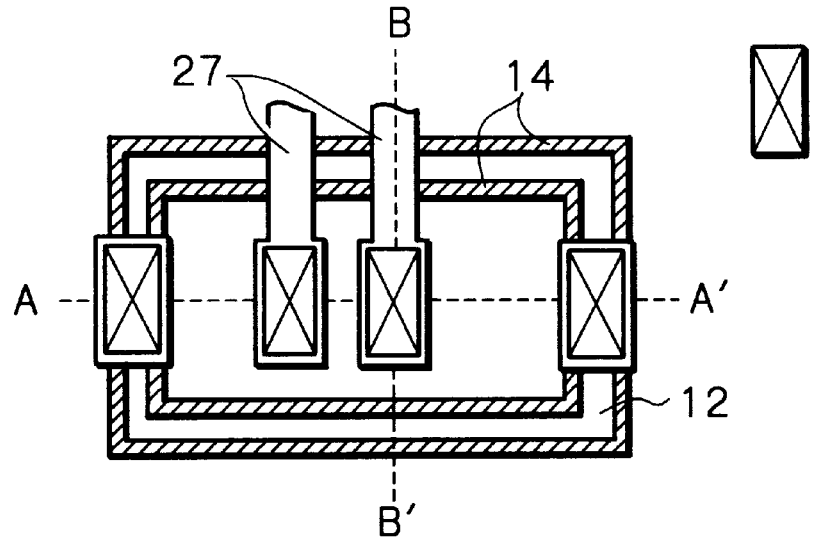
FIG. 22A is a plan view showing a semiconductor device representative of a fourth embodiment of the present invention.
Figure 22B:
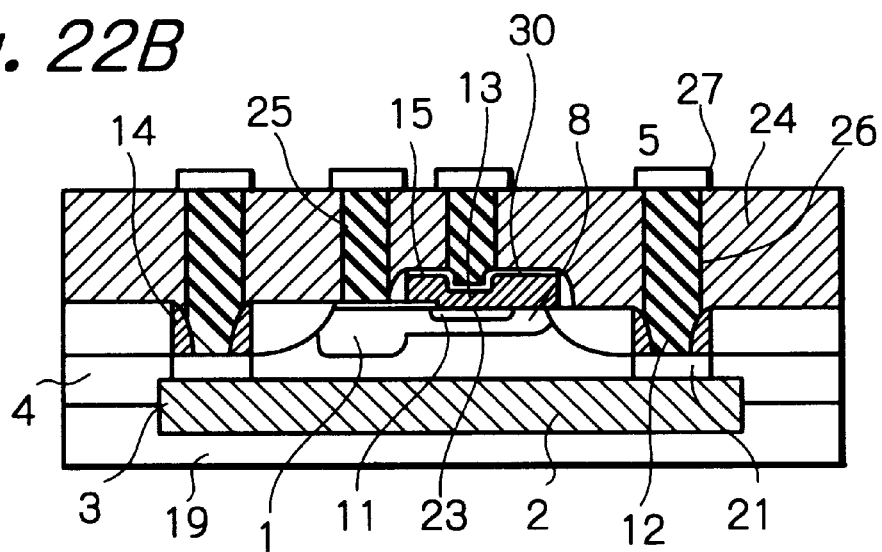
FIGS. 22B and 22C are sections along lines A–A' and B–B' of FIG. 22A, respectively.
Figure 22C:
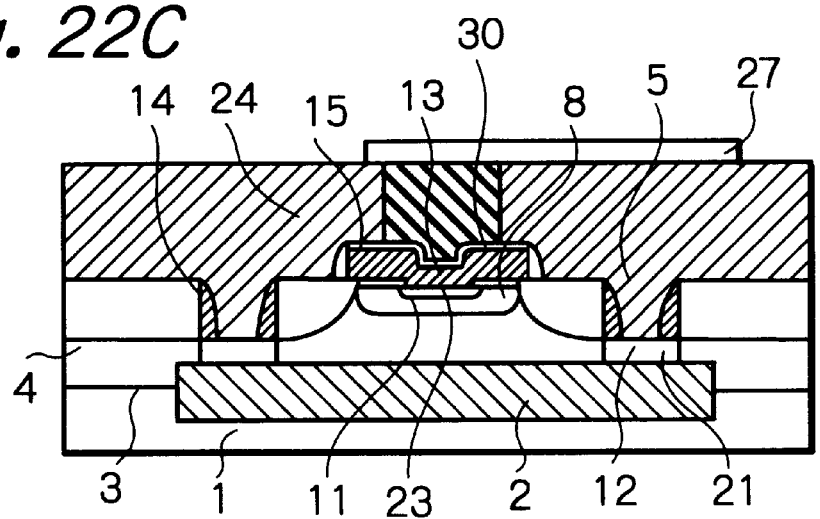

FIGS. 22A–22C show a fourth embodiment of the present invention. As shown in FIG. 22A, the collector contact hole 12 is formed in a ring-like configuration. The arsenic-containing polysilicon side walls 14 surround the entire walls of the collector contact hole 12. FIGS. 22B and 22C are respectively sections along lines A–A' and B–B' shown in FIG. 22A. The side walls 14 having silicified surfaces and therefore a low resistance are electrically connected to the n-type buried layer 2 via the collector contact diffusion layer 21.

As shown in FIG. 22A, contact at only two points sets up a condition equivalent to a condition which contact extending over the entire ring-like collector contact hole 12 would set up. This successfully reduces the collector resistance of the bipolar transistor to less than 50%, compared to the first to third embodiments. In addition, because the metal wirings 27 do not have to be arranged in a ring-like configuration, they may cross the ring-like collector contact hole 12 underlying the interlayer insulation film 24 even when the wiring layer to the emitter and base and the wiring layer to the collector are implemented by a single layer.

In summary, it will be seen that the present invention provides a method of producing a semiconductor device having various unprecedented advantages, as enumerated below.

(1) The collector contact hole of a bipolar transistor are formed before the gate electrodes of a CMOS transistor, so that the amount of overetching for forming the gate electrodes is reduced. Each gate electrode can therefore be provided with a desirable configuration as distinguished from an inversely tapered configuration. The resulting semiconductor device exhibits a desirable CMOS current drive ability.

(2) Even when a direct contact exists, the method of the invention reduces the undesirable digging depth of a substrate around the direct contact and thereby reduces a connection resistance between a diffusion layer and a direct contact lead-out electrode.

(3) A ring-like collector lead-out region is achievable which reduces a collector resistance to a noticeable degree.

Various modifications will become possible for those skilled in the art after receiving the teachings of the present disclosure. For example, the illustrative embodiments each is capable of obviating the problems of the conventional structures and methods even when the conductivity types of impurities are replaced with each other.

What is claimed is:

1. A method of producing a semiconductor device having a bipolar transistor and a CMOS transistor on a single semiconductor substrate, said method comprising the steps of:

(a) forming a first conductivity type buried layer and a second conductivity type buried layer on said semiconductor substrate, and growing an epitaxial layer over an entire surface of said substrate;

(b) forming a first insulation film for delimiting an active region of a bipolar transistor, an active region of a first conductivity type MOS transistor, and an active region of a second conductivity type MOS transistor;

(c) forming a first conductivity type or a second conductivity type well to separate said active regions of said first and second conductivity type MOS transistors and said bipolar transistor;

(d) forming a second insulation film on surfaces of said active regions of said bipolar transistor, said first conductivity type MOS transistor, and said second conductivity type MOS transistor;

(e) forming an emitter contact hole through said second insulation film above said active region of said bipolar transistor and a collector contact hole through said first insulation film between said active region of said bipolar transistor and one of said active regions of said first and second conductivity type MOS transistors, the collector contact hole extending to said epitaxial layer;

(f) forming a polysilicon layer over the second insulation film and within the emitter and collector contact holes; and (g) etching said polysilicon layer to form an emitter electrode above said active region of said bipolar transistor and gate electrodes above said active regions of said CMOS transistor.

2. A method as claimed in claim 1, wherein said collector contact hole is formed to surround an emitter and a base of said bipolar transistor.

3. A method as claimed in claim 1, wherein step (g) comprises etching said polysilicon layer such that polysilicon remains on a wall of said collector contact hole.

4. A method as claimed in claim 3, wherein said collector contact hole is formed to surround an emitter and a base of said bipolar transistor.

5. A method as claimed in claim 1, wherein step (g) comprises the step of etching said polysilicon layer to form a collector electrode inside of said collector contact hole and on top of said first insulation film.

6. A method as claimed in claim 5, wherein said collector contact hole is formed to surround an emitter and a base of said bipolar transistor.

7. In a semiconductor device having a bipolar transistor and a CMOS transistor on a single semiconductor substrate, a method of producing said semiconductor device comprising the steps of:

(a) forming a first conductivity type buried layer and a second conductivity type buried layer on said substrate, and growing an epitaxial layer over an entire surface of said substrate;

(b) forming a first insulation film for delimiting an active region of a bipolar transistor, an active region of a first conductivity type MOS transistor, and an active region of a second conductivity type MOS transistor;

(c) forming a first conductivity type or a second conductivity type well to separate said active regions of said first and second conductivity type MOS transistors and said bipolar transistor;

(d) forming a second insulation film on surfaces of said active regions of said bipolar transistor, said first conductivity type MOS transistor, and said second conductivity type MOS transistor;

(e) forming an emitter contact hole through said second insulation film above said active region of said bipolar transistor and a collector contact hole through said first insulation film between said active region of said bipolar transistor and one of said active regions of said first and second conductivity type MOS transistors, the collector contact hole extending to said epitaxial layer;

(f) forming a polysilicon layer over the second insulation film and within the emitter and collector contact holes; and (g) etching said polysilicon layer to form an emitter electrode above said active region of said bipolar transistor and gate electrodes above said active regions of said CMOS transistor.

8. A method as claimed in claim 1, wherein the step (e) of forming includes the step of etching the first and second insulation films in an etching mixture that can etch the first and second insulation films at the same time and at a faster rate than the epitaxial layer.

9. A method as claimed in claim 8, wherein the step (e) of forming includes the step of etching the first and second insulation films in an etching mixture that can etch the first and second insulation films at a rate 40 to 50 times faster than the epitaxial layer.

10. A method as claimed in claim 8, wherein the step (e) of forming includes the step of reactive ion etching in a gas mixture of $SF_6$ and CO.

11. A method as claimed in claim 1, wherein the step (g) of etching includes the step of overetching polysilicon by about 10–30%.

12. A method as claimed in claim 1, wherein a collector electrode is formed within said collector contact hole as a result of the step (g) of etching.

13. A method as claimed in claim 7, wherein the step (e) of forming includes the step of etching the first and second insulation films in an etching mixture that can etch the first and second insulation films at the same time and at a faster rate than the epitaxial layer.

14. A method as claimed in claim 13, wherein the step (e) of forming includes the step of etching the first and second insulation films in an etching mixture that can etch the first and second insulation films at a rate 40 to 50 times faster than the epitaxial layer.

15. A method as claimed in claim 13, wherein the step (e) of forming includes the step of reactive ion etching in a gas mixture of $SF_6$ and CO.

16. A method as claimed in claim 7, wherein the step (g) of etching includes the step of over etching polysilicon by about 10–30%.

17. A method as claimed in claim 7, wherein a collector electrode is formed within said collector contact hole as a result of the step (g) of etching.

18. A method of producing a semiconductor device having a bipolar transistor and a CMOS transistor, which includes a PMOS transistor and an NMOS transistor, on a single semiconductor substrate, said method comprising the steps of:

(a) forming buried and epitaxial layers on the semiconductor substrate;

(b) forming a field oxide layer between a bipolar transistor region and a CMOS transistor region and within the CMOS transistor region between a PMOS transistor region and a NMOS transistor region;

(c) forming a gate oxide layer on top of the transistor regions;

(d) etching the gate oxide layer to form an emitter contact hole through the gate oxide layer above the bipolar transistor region and the field oxide layer to form a collector contact hole through the field oxide layer between the bipolar transistor region and the CMOS transistor region, the collector contact hole extending to the epitaxial layer;

(e) forming a polysilicon layer on top of the gate oxide layer remaining after the step (c) of etching and within the emitter and collector contact holes; and (f) etching the polysilicon to form an emitter electrode on top of the bipolar transistor region and gate electrodes on top of each of the PMOS and NMOS transistor regions.

19. A method as claimed in claim 18, wherein the step (d) of etching includes the step of etching the gate oxide layer and the field oxide layer in an etching mixture that can etch oxides at a rate 40 to 50 times faster than the epitaxial layer material.

20. A method as claimed in claim 18, wherein the step (f) of etching includes the step of overetching the polysilicon by about 10–30%.

* * * * *